(12) United States Patent
Eisner et al.

(10) Patent No.: US 11,037,754 B2
(45) Date of Patent: *Jun. 15, 2021

(54) SCAN AND CORRECTOR MAGNET DESIGNS FOR HIGH THROUGHPUT SCANNED BEAM ION IMPLANTER

(71) Applicant: Axcelis Technologies, Inc., Beverly, MA (US)

(72) Inventors: Edward Eisner, Lexington, MA (US); Bo Vanderberg, Gloucester, MA (US)

(73) Assignee: Axcelis Technologies, Inc., Beverly, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/720,499

(22) Filed: Dec. 19, 2019

(65) Prior Publication Data

US 2020/0194221 A1 Jun. 18, 2020

Related U.S. Application Data

(63) Continuation of application No. 16/218,884, filed on Dec. 13, 2018, now Pat. No. 10,553,392.

(51) Int. Cl.
*H01J 37/153* (2006.01)
*H01J 37/317* (2006.01)
*H01J 37/147* (2006.01)

(52) U.S. Cl.
CPC ........ *H01J 37/153* (2013.01); *H01J 37/1475* (2013.01); *H01J 37/3171* (2013.01); *H01J 2237/05* (2013.01); *H01J 2237/152* (2013.01); *H01J 2237/31701* (2013.01)

(58) Field of Classification Search
CPC .. H01J 37/153; H01J 37/1475; H01J 37/3171; H01J 2237/05; H01J 2237/152; H01J 2237/31701
See application file for complete search history.

(56) References Cited

U.S. PATENT DOCUMENTS

| 4,922,106 A | 5/1990 | Berrian et al. |
| 9,679,739 B2 | 6/2017 | Eisner et al. |
| 10,553,392 B1* | 2/2020 | Eisner ................. H01J 37/1475 |

OTHER PUBLICATIONS

Notice of Allowance dated Sep. 30, 2019 in connection with U.S. Appl. No. 16/218,884.

* cited by examiner

*Primary Examiner* — Nicole M Ippolito
*Assistant Examiner* — Hanway Chang
(74) *Attorney, Agent, or Firm* — Eschweiler & Potashnik, LLC

(57) ABSTRACT

An ion implantation system and method provide a non-uniform flux of a ribbon ion beam. A spot ion beam is formed and provided to a scanner, and a scan waveform having a time-varying potential is applied to the scanner. The ion beam is scanned by the scanner across a scan path, generally defining a scanned ion beam comprised of a plurality of beamlets. The scanned beam is then passed through a corrector apparatus. The corrector apparatus is configured to direct the scanned ion beam toward a workpiece at a generally constant angle of incidence across the workpiece. The corrector apparatus further comprises a plurality of magnetic poles configured to provide a non-uniform flux profile of the scanned ion beam at the workpiece.

20 Claims, 5 Drawing Sheets

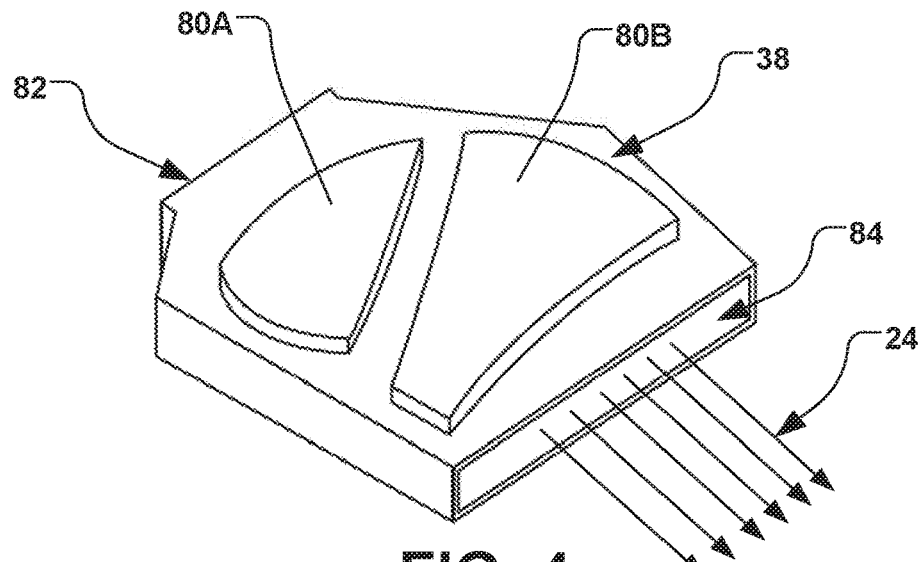
FIG. 4
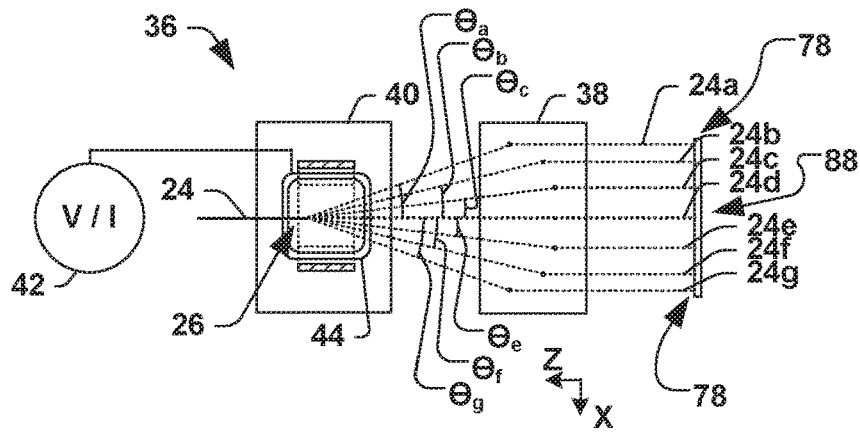 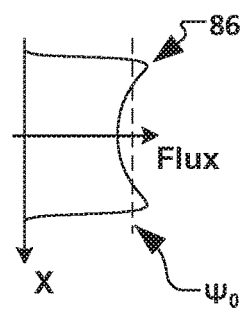
FIG. 5A  FIG. 5B
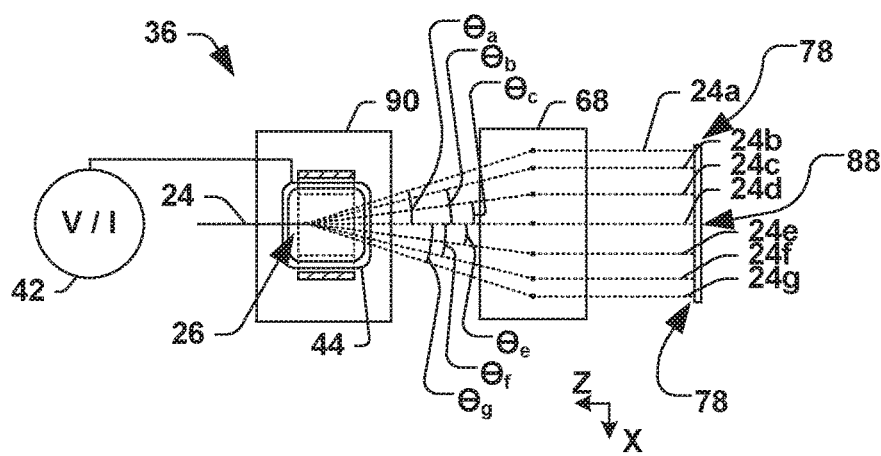 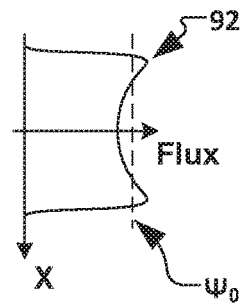
FIG. 6A  FIG. 6B

SCAN AND CORRECTOR MAGNET DESIGNS FOR HIGH THROUGHPUT SCANNED BEAM ION IMPLANTER

REFERENCE TO RELATED APPLICATIONS

This application is a Continuation of U.S. application Ser. No. 16/218,884 filed Dec. 13, 2018, entitled "SCAN AND CORRECTOR MAGNET DESIGNS FOR HIGH THROUGHPUT SCANNED BEAM ION IMPLANTER", the contents of which are herein incorporated by reference in their entirety.

FIELD OF THE INVENTION

The present invention relates generally to ion implantation systems, and more specifically to improved systems and methods for providing a predetermined uniformity and angular profile of a scanned ion beam.

BACKGROUND OF THE INVENTION

Ion implanters are conventionally utilized to place a specified quantity of dopants or impurities within semiconductor workpieces or wafers. In a typical ion implantation system, a dopant material is ionized, therein generating a beam of ions. The ion beam is directed at a surface of the semiconductor wafer to implant ions into the wafer, wherein the ions penetrate the surface of the wafer and form regions of desired conductivity therein. For example, ion implantation has particular use in the fabrication of transistors in semiconductor workpieces. A typical ion implanter comprises an ion source for generating the ion beam, a beamline assembly having a mass analysis apparatus for directing and/or filtering (e.g., mass resolving) ions within the beam, and a target chamber containing one or more wafers or workpieces to be treated.

Various types of ion implanters allow respectively varied dosages and energies of ions to be implanted, based on the desired characteristics to be achieved within the workpiece. For example, high-current ion implanters are typically used for high dose implants at low to medium energies, and medium-current to low-current ion implanters are utilized for lower dose applications, typically at higher energies.

As device geometries continue to shrink, shallow junction contact regions translate into requirements for lower and lower energies of the ion beam. Additionally, requirements for precise dopant placement have resulted in ever-more demanding requirements for minimizing beam angle variation, both within the beam, and across the substrate surface. For example, in certain applications, implants at energies down to 300 electron Volts are desirable, while concurrently minimizing energy contamination, maintaining tight control of angle variation within the ion beam as well as across the workpiece, and also while providing high workpiece processing throughput.

Hybrid scanned beams can provide very good dose uniformity at high throughput, whereby the ion beam is electrically or magnetically scanned relative to the workpiece, and whereby the workpiece is mechanically translated through the scanned ion beam. However, for low energy implants, the throughput of workpieces through the system is limited by the size of the ion beam and the large scan amplitudes utilized to provide full over-scan of the workpiece by the ion beam.

SUMMARY OF THE INVENTION

The present disclosure provides a system and a method by which an efficiency of an ion implantation system is increased beyond conventional systems, wherein an improved design of one or more of a scan magnet and corrector magnet are advantageously provided. The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The present disclosure provides a system and method for providing a non-uniform flux profile of a scanned ion beam. In accordance with one exemplary aspect of the disclosure, an ion implantation system is provided, wherein an ion beam is configured to be scanned at an ion beam scan frequency across a surface of a workpiece, therein defining a scanned ion beam (also called a "scanned ribbon"). For example, a spot ion beam is formed and provided to a scanner, and a scan waveform having a time-varying potential is applied to the scanner. The ion beam is scanned by the scanner across a scan path, generally defining a scanned ion beam comprised of a plurality of beamlets. The scanned beam is then passed through a corrector apparatus. The corrector apparatus is configured to direct the scanned ion beam toward a workpiece at a generally constant angle of incidence across the workpiece. The corrector apparatus further comprises a plurality of magnetic poles configured to provide a non-uniform flux profile of the scanned ion beam at the workpiece.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 4 is perspective view of the magnetic poles and beamguide of a corrector apparatus in accordance with various aspects of the present disclosure.

FIG. 5A is a schematic representation of an ion beam passing through a scanner and corrector apparatus in accordance with various aspects of the present disclosure.

FIG. 5B is graph illustrating a non-uniform beam flux profile using the scanner and corrector apparatus of FIG. 5A.

FIG. 6A is a schematic representation of a scanned ion beam passing through another scanner and another corrector apparatus in accordance with various aspects of the present disclosure.

FIG. 6B is graph illustrating a non-uniform beam flux profile using the scanner and corrector apparatus of FIG. 6A.

DETAILED DESCRIPTION OF THE INVENTION

Figure 1A:
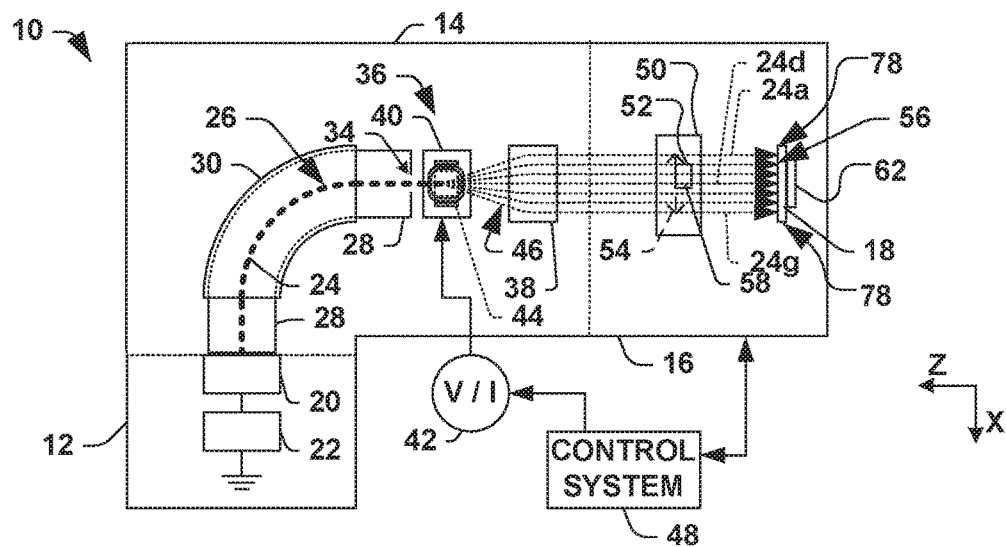
FIG. 1A is one embodiment of an ion implantation system with a scanner, corrector, and dosimetry system in accordance with various aspects of the present disclosure.

The present invention will now be described with reference to the drawings wherein like reference numerals are used to refer to like elements throughout, and wherein the illustrated structures are not necessarily drawn to scale.

FIG. 1A illustrates an exemplary ion implantation system 10 comprising a terminal 12, a beamline assembly 14, and an end station 16, wherein the ion implantation system is configured to implant ions into a workpiece 18 positioned in the end station. The terminal 12, for example, comprises an ion source 20 powered by a high voltage power supply 22, wherein the ion source produces and directs an ion beam 24 to the beamline assembly 14. For example, ions produced in the ion source 20 are extracted and formed into the ion beam 24, whereby the ion beam is directed along a beam path 26 within the beamline assembly 14 toward the end station 16.

The beamline assembly 14, for example, comprises a beamguide 28 and a mass analyzer 30, a resolving aperture 34, a scanning system 36, and a corrector apparatus 38. A dipole magnetic field is established within the mass analyzer 30 to pass only ions of appropriate charge-to-mass ratio through the resolving aperture 34. The scanning system 36, for example, may comprise an electrostatic or magnetic scanning system. The scanning system 36 illustrated in the exemplary embodiment of FIG. 1A shows a magnetic scanner 40 having a power supply 42 coupled to scanner coils 44. The scanner 40 is positioned along the beam path 26 and receives the ion beam 24 after being mass analyzed by the mass analyzer 30, wherein the scanner of FIG. 1A magnetically scans the ion beam to generally define a scanned ion beam 46 (e.g., also referred to as a "scanned ribbon"). The corrector apparatus 38, for example, directs the scanned ion beam 46 to the end station 16 such that the scanned ion beam strikes the workpiece 18 at a generally constant angle of incidence across the workpiece. The scanning of the ion beam 24 to form the scanned ion beam 46, for example, is controlled by a control system 48, such that the control system generally controls the power supplied to the scanner coils 44, thus magnetically scanning the ion beam across the workpiece 18.

The ion implantation system 10 may further comprise various beam forming and shaping structures (not shown) extending between the ion source 20 and the end station 16, wherein the forming and shaping structures maintain and bound the ion beam 24 as it is transported to the workpiece 18 in the end station 16. This passageway through which the ion beam 24 is maintained is typically kept at vacuum to reduce the probability of ions being deflected from the beam path 26 via collisions with air molecules.

The ion implantation system 10 may employ different types of end stations 16. For example, "batch" type end stations can simultaneously support multiple workpieces 18, such as on a rotating support structure, wherein the workpieces are rotated through the path of the ion beam until all the workpieces are completely implanted. A "serial" type end station, on the other hand, supports a single workpiece 18 along the beam path for implantation, wherein multiple workpieces are implanted one at a time in serial fashion, with each workpiece being completely implanted before implantation of the next workpiece begins.

The illustrated end station 16 is a "serial" type end station that supports a single workpiece 18 along the beam path for implantation (e.g., a semiconductor wafer, display panel, or other workpiece to be implanted with ions from the beam 24), wherein a dosimetry system 50 is situated near the workpiece location for calibration measurements prior to implantation operations. During calibration, the ion beam 24 passes through the dosimetry system 50. The dosimetry system 50, for example, comprises one or more profilers 52 that are configured to traverse a profiler path 54, thereby measuring the profile of the ion beam 24 (e.g., the scanned ion beam 46). The corrector apparatus 38 directs the scanned ion beam 46 to the end station 16 such that the scanned beam strikes one or more profilers 52 of the dosimetry system 50 at a generally constant angle of incidence.

The profiler path 54, for example, is positioned along an implantation plane associated with a surface 56 of the workpiece 18. The one or more profilers 52, for example, comprise a current density sensor 58 (e.g., a Faraday cup) for measuring the current density of the scanned ion beam 46. The current density sensor 58 moves in a generally orthogonal fashion relative to the scanned ion beam 46 and thus traverses the width of the scan path. The dosimetry system 50, for example, is further operably coupled to the control system 48 to receive command signals therefrom and to provide measurement values thereto to implement the measurement aspects of the calibration method of the disclosure as described further herein.

In accordance with one exemplary aspect, the scanner 36 receives the ion beam 24, and a current waveform applied by the power supply 42 to the scanner coils 44 operates to scan the ion beam 24 back and forth in the X direction (e.g., the scan direction) to spread the ion beam out into an elongated "scanned ribbon" beam (e.g., the scanned ion beam 46), having an effective X direction width that may be at least as wide as or wider than the workpiece(s) 18 of interest. The scanned ion beam 46 is then passed through the corrector apparatus 38 that directs the beam toward the end station 16 generally parallel to the Z direction (e.g., generally perpendicular to the surface 56 of the workpiece 18).

In an electrostatic scanning system (not shown), a power supply or supplies is connected to multiple electrodes spaced around the beam. The electric field between the electrodes is further adjusted to scan the ion beam. For purposes of this disclosure, all different types of scanning systems 36 are considered, and the magnetic system of FIG. 1A is one illustrative example of such a scanning system.

Figure 1B:
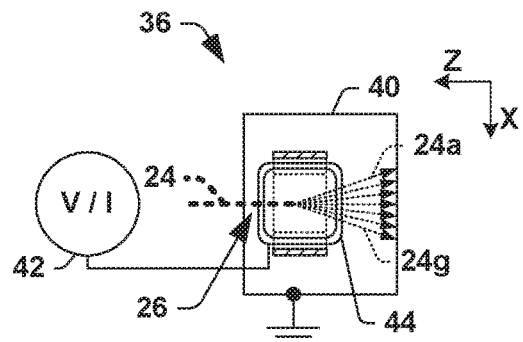
FIG. 1B is one embodiment of the scanner of FIG. 1A and several scanned ion beams.
Figure 1C:
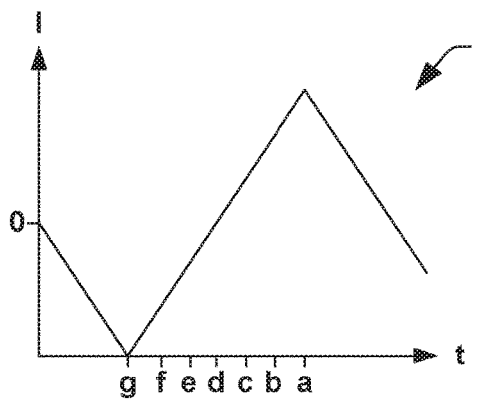
FIG. 1C is one embodiment of a triangular scanning current waveform in the scanner of FIGS. 1A and 1B.

An exemplary magnetic version of the scanning system 36 is further illustrated in FIG. 1B, wherein the power supply 42 provides alternating currents to the coils 44, as illustrated in a waveform 60 in FIG. 1C. The time-varying waveform 60 (e.g., a triangular waveform) creates a time varying magnetic field across the beam path 26 therebetween, by which the ion beam 24 is bent or deflected (e.g., scanned) along a scan direction (e.g., the X direction in FIGS. 1A, 1B, and 2B-2F).

When the scanner magnetic field is in the direction out of the page such as at times "e" and "g" in FIG. 1C, the positively charged ions of the ion beam 24 are subjected to a lateral force in the negative X. When the current I is zero, such as at time "d" in FIG. 1C, the beam 24 passes through the scanner 40 unmodified. When the field is in the direction into the page (e.g., times "a" and "c" in FIG. 1C), the positively charged ions of the ion beam 24 are subjected to a lateral force in the positive X direction.

Figure 1D:
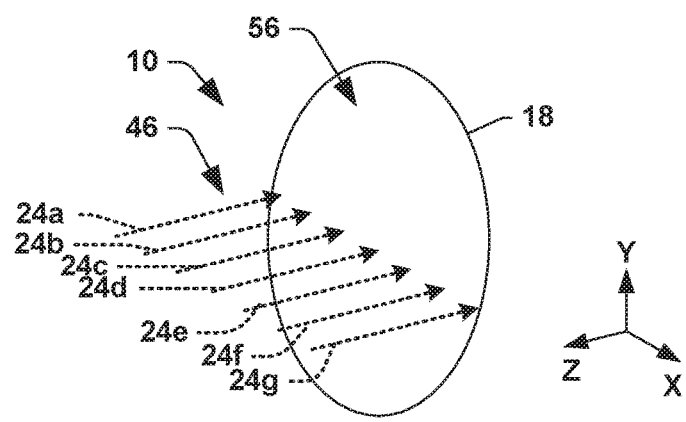
FIG. 1D is a perspective view illustrating one scanned ion beam striking a workpiece in the system of FIG. 1A at several discrete points in time.

FIG. 1B shows the resulting deflection associated with the scanned beam 46 as the ion beam 24 passes through the scanner 40 at several discrete points in time during scanning prior to entering the corrector apparatus 38 of FIG. 1A. FIG. 1D illustrates the scanned ion beam 46 (e.g., the ion beam 24a-24g) impacting the workpiece 18 at the corresponding times "a" through "g" indicated in FIG. 1C. The scanned and parallelized ion beam 24a in FIG. 1D corresponds to the applied electrode voltages or currents at the time "a" in FIG. 1C, and subsequently, the ion beam 24b-24g is illustrated in FIG. 1D for scan voltages or currents at corresponding times "b"-"g" of FIG. 1C for a single generally horizontal scan across the workpiece 18 in the X direction.

As illustrated in FIG. 1A, a translation apparatus 62 (e.g., a mechanical actuation apparatus) translates the workpiece 18 in the Y-direction (e.g., slow scan direction) concurrent with scanning of the ion beam 24 back and forth in the X-direction (e.g., fast scan direction) via the scanner 40, whereby the ion beam 24 is imparted on the surface 56 of the workpiece 18.

The present disclosure appreciates that in an idealized implanter, a triangle wave in voltage or current applied to the scanner 40 produces a triangle wave in beam angle, and after the corrector apparatus 38, a uniform scanned ribbon beam 46 (e.g., a uniform flux profile). However, due to various reasons, such an ideal implanter is difficult to achieve. Further, in certain instances, it may be beneficial to vary the dose profile on the workpiece 18 in order to achieve various results.

In particular, the current waveform from the power supply 42 to the scanner 40 can be modified to produce a desired dose profile on the workpiece 18. While in some instances, the dose profile is desired to be uniform, other non-uniform profiles are also sometimes desirable. The specific current waveform that produces a desired flux profile, for example, generally depends on how the beam current and shape of the ion beam 24 change as the ion beam is scanned across the workpiece 18. An ion beam 24 having a minimal size may have little to no change in shape across the scan, thereby producing waveforms with a minimum amplitude and minimal modifications or deviations from the nominal triangle wave. Such a minimally-sized ion beam 24, for example, is thus most efficient and least demanding on the scanner 40.

In order to maintain a small size of the ion beam 24 and minimize space-charge blow-up, for example, magnetic scanners and corrector apparatuses are utilized in high-current beam lines, as opposed to electrostatic scanners and corrector apparatuses which are used in lower-current beam lines, such as those used in medium-current implanters. In order to maintain generally constant shapes of the ion beam 24 across the scan, for example, S-bend magnets can be utilized in the corrector apparatus 38, whereby path lengths of the ion beam are more similar across the scan, as compared to the utilization of a single-bend magnet or electrostatic parallelizing lens in the corrector apparatus.

Figure 2:
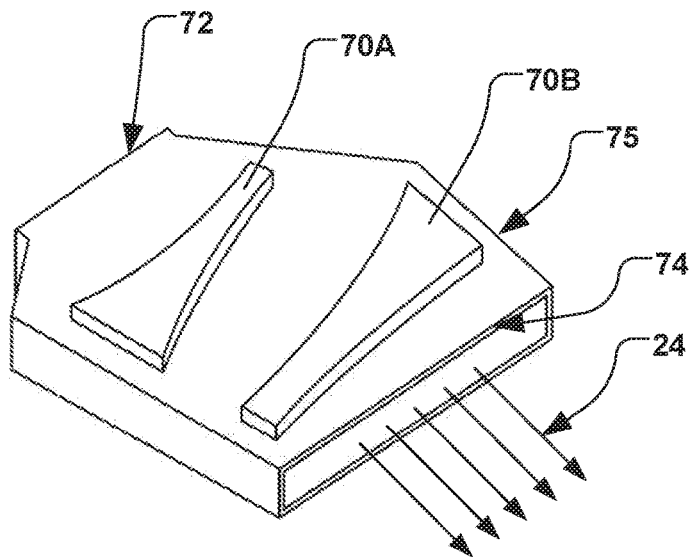
FIG. 2 is a perspective view of the magnetic poles and beamguide of a conventional corrector apparatus.
Figure 3A:
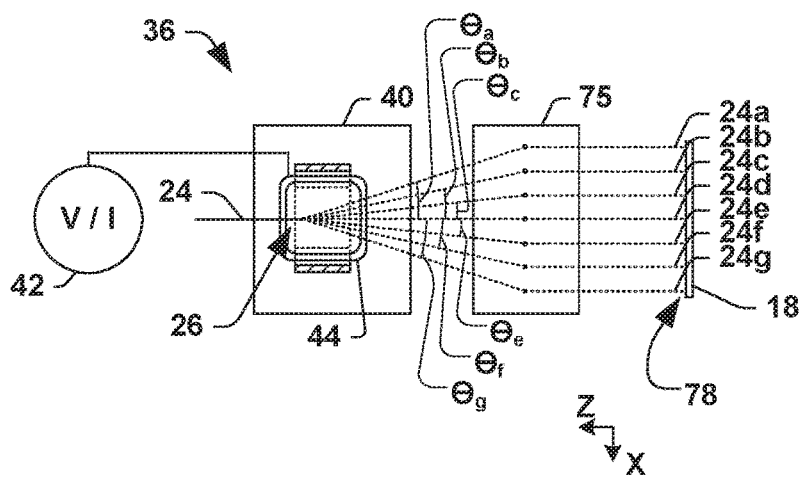
FIG. 3A is a schematic representation of an ideal ion beam passing through an ideal scanner and corrector apparatus.
Figure 3B:
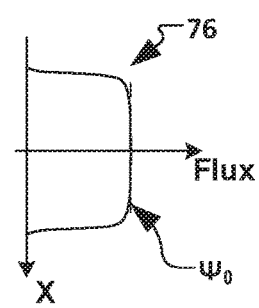
FIG. 3B is a graph illustrating an ideal beam flux profile using the ideal scanner and corrector apparatus of FIG. 3A.
Figure 3C:
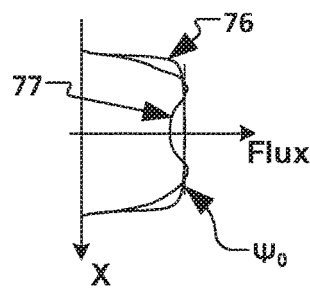
FIG. 3C is a graph illustrating an exemplary flux profile produced using a triangle wave current waveform that is not uniform.

For example, FIG. 2 illustrates a conventional configuration of poles 70A, 70B associated with a respective entrance 72 and exit 74 of a conventional corrector apparatus 75. For simplicity, FIG. 2 does not show the yoke and coils of the magnet or magnets because these are not generally as important to defining the beam trajectories. FIG. 3A further illustrates the conventional corrector apparatus 75 that could be positioned downstream of the scanner 40, whereby the paths 26 of the various trajectories of the ion beams 24a-24g are at different scan angles $\Theta_a$-$\Theta_g$ as they exit the scanner, wherein the scan angles $\Theta_a$-$\Theta_g$ are uniformly spaced over time. When an "ideal" ion beam (e.g., a "point" ion beam") is fully scanned over the workpiece using a triangle wave (as shown in FIG. 1C) a generally uniform flux profile 76 across the workpiece 18 is produced, as illustrated in FIG. 3B. The generally uniform flux profile 76 of FIG. 3B, for example, has an average flux $\psi_0$ that results from substantially uniform scanning and conventional corrector apparatus 75. However, in reality, as opposed to the above-described "ideal" ion beam, a "real" ion beam changes shape, size, and current as the beam is scanned, and a real flux profile 77 produced with a triangle wave current waveform is not uniform, as illustrated in FIG. 3C.

When beam currents of the ion beam 24 are increased, however, it further becomes difficult to maintain small sizes and constant properties of the ion beam. At larger beam sizes, for example, differences in shape of the ion beam 24 across the scan become more relevant, as the shape of the ion beam affects larger portions of the workpiece 18. A reduction in beam flux, for example, can be seen at edges 78 of the workpiece 18 when using the nominal triangle waveform 60 of FIG. 1C. As a result, uniformity correction via the scan waveform 60 becomes more difficult, as more highly modified waveforms are implemented in attempts to provide the uniform flux profile on the workpiece 18. Such uniformity correction can further result in lower throughput of workpieces 18 through the system 10 of FIG. 1A, since the ion beam 24 spends more time at the edges 78 of the workpiece where it is implanting a smaller fraction of the workpiece.

Thus, in accordance with the present disclosure, increased throughput of workpieces 18 through the system 10 can be attained, at least partially, by configuring the scanner 40 and/or corrector apparatus 38 to produce a non-uniform flux profile across the workpiece 18 when using the nominal triangle waveform 60 of FIG. 1C and an ideal point beam, while still maintaining parallelism in the ion beam 24. The non-uniform flux profile, for example, is then corrected to be uniform, or corrected to have a predetermined non-uniform profile, by adjustment of the waveform applied to the scanner 40. FIG. 5 illustrates one such example of the corrector apparatus 38 in accordance with various aspects of the present disclosure, wherein poles 80A, 80B of the corrector apparatus are configured to provide a non-uniform flux profile of the ion beam 24 as it passes through an entrance 82 and exit 84, thereof.

Various shapes of the poles 80A, 80B of the corrector apparatus 38, associated with the scanner 40 of FIG. 5A, for example, can advantageously provide a non-uniform flux profile 86, as illustrated in FIG. 5B, whereby a larger amount of beam flux is provided proximate to the edges 78 of the workpiece 18 than proximate a center 88, thereof. It should be noted that the present disclosure may be applied to any corrector apparatus 38, whether the corrector apparatus comprises a single magnet, or multiple magnets in an S-bend configuration. Further, it should be noted that the scanner 40 and any magnet associated therewith may be bipolar (as shown), or unipolar, such that the ion beam 24 is always bent.

In accordance with one exemplary aspect, again assuming an ideal point beam, the beam flux provided to the workpiece 18 is inversely proportional to the spacing of the trajectories of the beams 24a-24g. That is, the uniform spacing over time provided by the scanner 40 between beams 24a-24b, 24b-24c, 24c-24d, etc. produces a uniform flux out of the scanner 40. In the present example, the various scan angles $\Theta_a$-$\Theta_g$ are whole number multiples of any given scan time t. Due to the configuration of the poles 80A, 80B of the corrector apparatus 38 of FIG. 5A, however, the varying densities between beams 24a-24b, 24b-24c, 24c-24d, etc. produce a varying flux for said uniform scanning of the beam, with more flux at the edges 78 of the workpiece 18 where the beams are closer to one another, and less dense in the center 88 where they are further apart. Accordingly, the non-uniform flux profile 86 of FIG. 5B is achieved, while providing uniform flux profile out of the scanner, and thus providing the similar average flux $\psi_0$ to that resulting from the uniform scanning of FIG. 4B.

In accordance with another exemplary aspect, as illustrated in FIG. 6A, a modified scanner 90 may be configured such that the magnets of the scanner provide a non-linear relationship between drive current and scan angle in conjunction with the conventional corrector magnet 68.

Accordingly, the modified scanner 90 may be configured to provide a flux profile 92 of FIG. 6B that is generally equivalent to the flux profile 86 of FIG. 5B, assuming an ideal point beam and a triangle current waveform. However, while a conventional scanner produces a uniform change in scan angle for a uniform change in current, poles of the scanner of the present disclosure may be shaped to have a predetermined profile such that a uniform change in current provides a non-uniform change in scan angle.

Thus, the flux profile 92 of FIG. 6B may be achieved utilizing the same input to the scanner 40, while attaining greater flux at the edges 78 to compensate for lost beam current associated with the edges of the scan with a real ion beam. Conventionally, the scanner 40 of FIG. 5A would hold the ion beam 24 proximate to the edges 78 for longer times than the remaining portion of the workpiece 18 to attain the desired flux at the edges, whereby an AC waveform to the scanner may be highly modified and potentially be bandwidth limited. The present disclosure provides a solution to such a complex and deleterious AC scanning waveform, whereby the scanner and corrector systems advantageously provides a greater amount of flux to the edges 78 of the workpiece.

For example, the flux at the edge(s) 78 of the workpiece 18 may be between 10% and 100% greater than the flux at the center 88 of the workpiece. In another example, the flux profile 86, 92 of FIGS. 5B and 6B may be generally parabolic with an unmodified scan waveform applied to the scanner 40. In yet another example, the flux profile 86, 92 with an unmodified scan waveform is generally uniform over a central region associated with the center 88 of the workpiece 18 of FIGS. 5A and 6A, and increases only or primarily at the edges 78 of the workpiece, wherein the central region represents between 20% and 80% of an overall length or diameter of the workpiece.

As such, the varying densities between beams 24a-24b, 24b-24c, 24c-24d, etc. produce varying flux for non-uniform scanning of the beam via the modified scanner 90, thus producing more flux at the edges 78 of the workpiece 18 where the beams are closer to one another, and less dense in the center 88 where they are further apart. In the present example, the various scan angles $\Theta_a$-$\Theta_g$ may differ for any given scan time t. Thus, when the modified scanner 90 is driven with the triangular current waveform 60 of FIG. 1C, the resulting trajectories of beams 24a-24g provide a similar flux profile 92 of FIG. 6B as the flux profile 86 of FIG. 5B.

Figure 7:
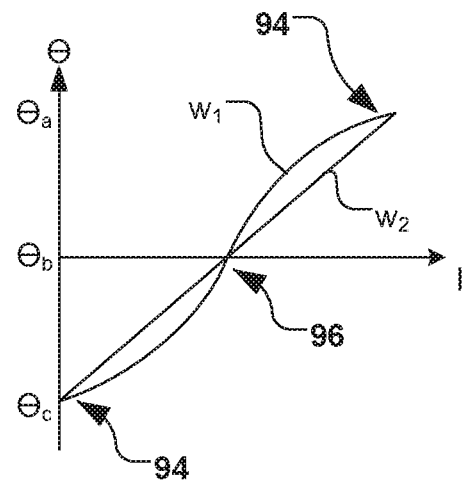
FIG. 7 is a chart illustrating first and second functions relating scan angle to scan current applied to a scanner in accordance with various aspects of the present disclosure.

FIG. 7 illustrates first and second functions $w_1$ and $w_2$ relating scan angle $\Theta$ to scan current I applied to the scanner with a real beam after uniformity correction has modified the scan waveform to provide uniform flux. The first function $w_1$ provides a uniform flux profile (e.g., similar to the uniform flux profile 76 in FIG. 3B) after uniformity correction when used with the conventional scanner and corrector system of FIG. 3A, where the slope is smaller at extremes 94 of the scan angles $\Theta$ and larger in the middle 96 of FIG. 7. The second function, $w_2$, is the function after uniformity correction for the disclosed, improved systems where the scan angle $\Theta$ is a more linear function of scan current I.

In accordance with another exemplary aspect, the present disclosure appreciates that the non-uniform flux profiles 86, 92 of FIGS. 5B and 6B can be achieved via a combination of the corrector apparatus 38 of FIG. 5A and the modified scanner 90 of FIG. 6A. For example, various designs of the physical magnets and poles 80A, 80B associated with either of the corrector apparatus 38 of FIG. 5 and/or modified scanner 90 of FIG. 6A are contemplated, whereby modified optics and techniques can be utilized in designing various pole shapes.

Figure 8:
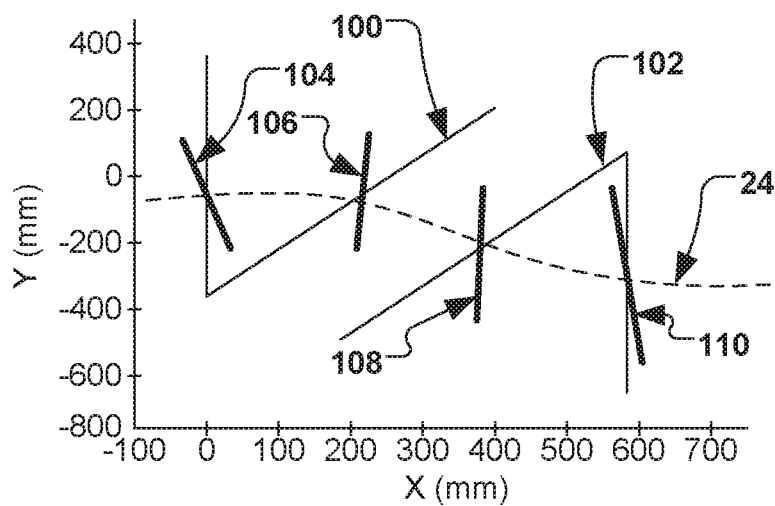
FIG. 8 is a chart illustrating various pole designs in accordance with various aspects of the present disclosure.

For example, FIG. 8 illustrates a first pole edge 100 and second pole edge 102 configured to provide a particular desired flux profile. The first and second pole edges 100, 102, for example, may be associated with the conventional corrector 68 of FIG. 6A (e.g., a standard S-bend magnet), while modified pole edges 104, 106, 108, 110 of FIG. 8 may be associated with the corrector apparatus 38 of FIG. 5A, whereby the non-uniform flux profiles 86, 92 of FIGS. 5B and 6B are generally defined by the beam 24, respectively. The modified pole edges 104, 106, 108, 110 of FIG. 8 may be accordingly configured to achieve various desired optical properties of the magnet. For example, pole rotations, pole edge curvature, pole face curvature, etc. may be utilized in the configuration of the modified pole edges 104, 106, 108, 110.

While some aspects of the present disclosure may relate to one embodiment of the ion implantation system(s) described herein, other aspects relate to methods for increasing a throughput of workpieces through the ion implantation system(s). While these methods are illustrated and described as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

Figure 9:
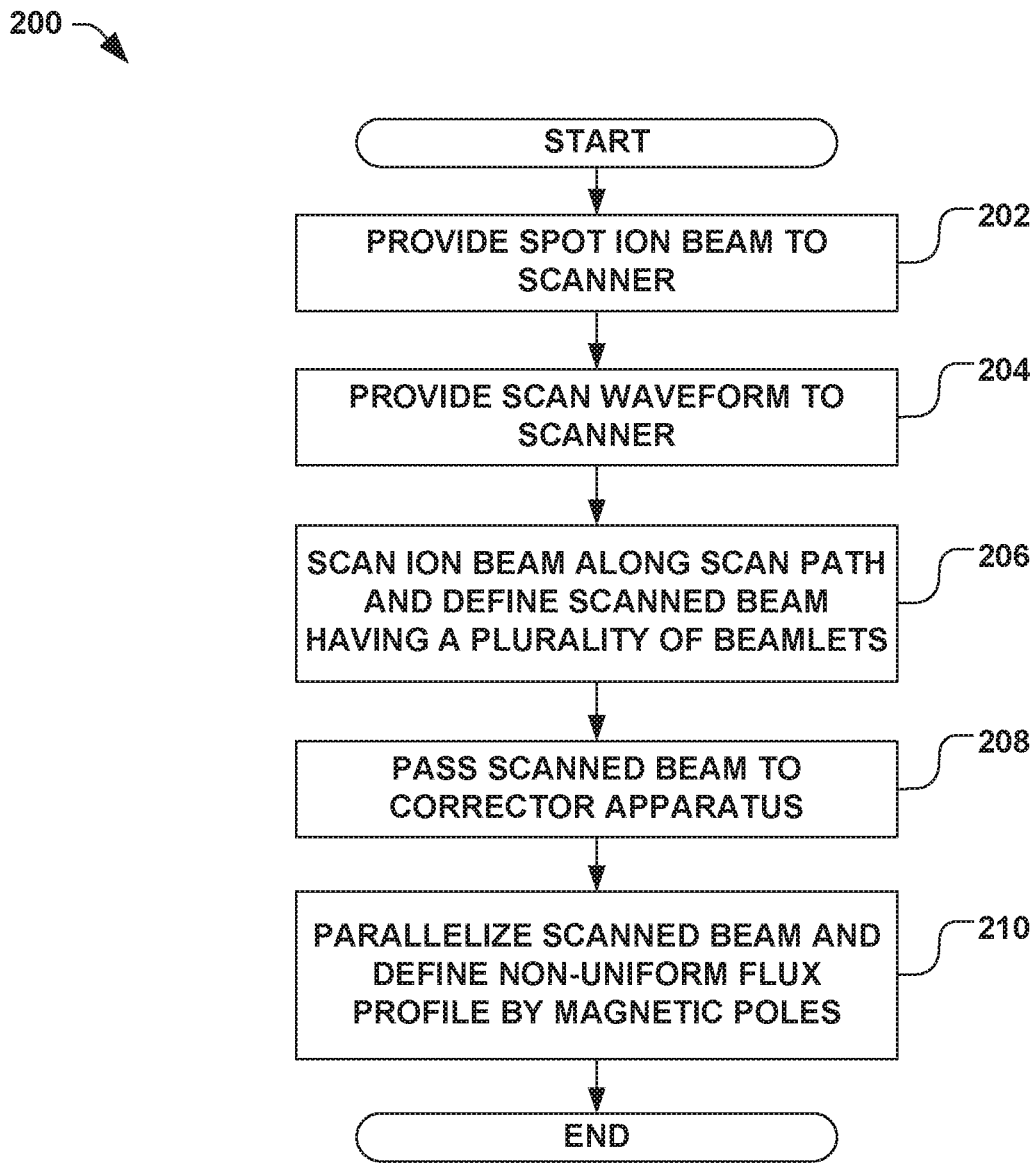
FIG. 9 is a flow diagram illustrating a method for providing a non-uniform flux profile to a workpiece in accordance with various aspects of the present disclosure.

FIG. 9 illustrates an exemplary method 200 for controlling the flux profile of a scanned ribbon beam (e.g., a scanned spot beam). In act 202 of FIG. 9, for example, a spot ion beam is provided to a scanner, and in act 204, a scan waveform having a time-varying potential is applied to the scanner. The scan waveform, for example, may comprise a triangle wave. In act 206, the spot ion beam is scanned across a scan path, therein generally defining a scanned ion beam comprised of a plurality of beamlets. In act 208, the scanned ion beam is passed through a corrector apparatus, wherein the corrector apparatus is configured to direct the scanned ion beam toward a workpiece at a generally constant angle of incidence across the workpiece. In act 210, a plurality of magnetic poles of the scanner and corrector apparatuses provide a non-uniform flux profile of the scanned ion beam at the workpiece with an ideal point beam scanned fully over the workpiece.

The present disclosure thus provides a non-uniform flux profile prior to uniformity correction in an ideal case. For example, the present disclosure contemplates one or more of the scanner and corrector apparatus being configured such that, with the ideal case of a point beam scanned fully over the workpiece at substantially constant scan speed, the flux substantially monotonically increases from the center of the workpiece to the edges of the workpiece. After uniformity correction with a real beam, the flux profile is substantially uniform or has a predetermined non-uniformity. Conventionally, the edges of the workpiece experience decreased current for various reasons discussed above, thus providing a generally parabolic flux profile having decreased flux near the edges of the workpiece. In order to account for such decreased flux near the edges, uniformity correction routines have been conventionally performed to hold the ion beam at the edges for extended times in order increase the flux and provide greater uniformity as shown in FIG. 7. However, such holding of the ion beam at the edges wastes beam current due, at least in part, to portion(s) of the width of the ion beam extending beyond the workpiece when at the edge of a scan.

The present disclosure advantageously utilizes the scanner and corrector apparatuses to increase beam flux at the edges of the workpiece, such that when such lower current is present at the edge, the net flux profile is flatter, and the scan system and uniformity correction can be configured to hold the ion beam for a shorter duration at the edge, thus wasting less beam current.

The present disclosure contemplates providing various magnetic fields to a corrector apparatus and/or a scanner, whereby the pole shaping, pole face rotations, and curvatures associated with respective magnets provide the desired non-uniform flux profile described herein. For example, a face of the magnetic pole may be varied to effectively change the path length through the magnetic field for each beamlet across the ribbon beam. Varying the path length through the magnetic field thus varies the degree to which the beamlet bends, and can thus be similarly varied to exit the corrector apparatus in a parallel manner. However, in accordance with the present disclosure, beamlets associated with edges of the workpiece are closer together than in the middle of the workpiece, thus providing more flux at the edges of the workpiece than in the middle.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An ion implantation system, comprising:
   an ion source configured to form an ion beam;
   a mass analyzer configured to mass analyze the ion beam;
   a power source configured to provide a scan waveform;
   a scanner configured to selectively scan the ion beam along a scan path based on the scan waveform, therein defining a scanned ion beam; and
   a corrector apparatus configured to transport the scanned ion beam toward a workpiece at a generally constant angle of incidence across the workpiece, wherein one or more of the scanner and corrector apparatus are configured to provide the scanned ion beam having a flux that increases from a first beam flux associated with a central region of the workpiece to a second beam flux associated with an edge of the workpiece.

2. The ion implantation system of claim 1, wherein the corrector apparatus comprises a plurality of magnetic poles configured to define a non-uniform flux profile of the scanned ion beam at the workpiece.

3. The ion implantation system of claim 2, wherein the non-uniform flux profile is generally defined by the first beam flux associated with the edge of the workpiece and the second beam flux associated with the central region of the workpiece.

4. The ion implantation system of claim 3, wherein the first beam flux is between 10% and 100% greater than the second beam flux.

5. The ion implantation system of claim 2, wherein the non-uniform flux profile comprises the flux being generally uniform over the central region of the workpiece and increases at the edge of the workpiece, where the central region represents between 20% and 80% of a length of the workpiece.

6. The ion implantation system of claim 2, wherein the non-uniform flux profile is generally parabolic.

7. The ion implantation system of claim 2, further comprising a controller configured to control the non-uniform flux profile via a control of one or more of the scanner and corrector apparatus.

8. The ion implantation system of claim 1, wherein the corrector apparatus comprises a pair of opposite polarity dipole magnets in an s-bend configuration.

9. An ion implantation system, comprising:
   an ion source configured to form an ion beam;
   a mass analyzer configured to mass analyze the ion beam;
   a scanner power source configured to provide a scan waveform;
   a scanner configured to selectively scan the ion beam along a scan path based on the scan waveform, therein defining a scanned ion beam; and
   a corrector apparatus configured to transport the scanned ion beam toward a workpiece at a generally constant angle of incidence across the workpiece, wherein one or more of the scanner and corrector apparatus are configured to provide the scanned ion beam having a non-uniform flux profile without modifying the scan waveform as the ion beam is scanned across the workpiece.

10. The ion implantation system of claim 9, further comprising a controller configured to control the non-uniform flux profile via a control of one or more of the scanner and corrector apparatus.

11. The ion implantation system of claim 10, wherein controller is further configured to control the scanner power source such that the scanner is further configured to provide the non-uniform flux profile of the scanned ion beam at the workpiece.

12. The ion implantation system of claim 9, wherein the scanner comprises a magnetic scanner.

13. The ion implantation system of claim 9, wherein the corrector apparatus comprises a pair of opposite polarity dipole magnets in an s-bend configuration.

14. The ion implantation system of claim 9, wherein a flux at an edge of the workpiece is between 10% and 100% greater than the flux at a center of the workpiece.

15. The ion implantation system of claim 9, wherein the non-uniform flux profile is generally parabolic.

16. The ion implantation system of claim 9, wherein the non-uniform flux profile is substantially uniform over a central region and increases at an edge of the workpiece, where the central region represents between 20% and 80% of a length of the workpiece.

17. The ion implantation system of claim 9, wherein the corrector apparatus comprises a plurality of magnetic poles configured to define the non-uniform flux profile of the scanned ion beam at the workpiece.

18. A method for providing a non-uniform flux of a scanned ribbon ion beam, the method comprising:
providing an ion beam to a scanner;
providing a scan waveform having a time-varying potential to the scanner, therein scanning the ion beam across a scan path and generally defining a scanned ion beam comprised of a plurality of beamlets; and
passing the scanned ion beam through a corrector apparatus, wherein the corrector apparatus is configured to direct the scanned ion beam toward a workpiece at a generally constant angle of incidence across the workpiece, and wherein the corrector apparatus is further configured to provide a non-uniform flux profile of the scanned ion beam at the workpiece without modifying the scan waveform.

19. The method of claim 18, wherein the time-varying potential relates to at least one of a time-varying voltage or a time-varying magnetic field.

20. The method of claim 18, wherein a flux of the ion beam at an edge of the workpiece is between 10% and 100% greater than the flux of the ion beam at a center of the workpiece.

* * * * *